(12) United States Patent
Sun et al.

(10) Patent No.: US 9,343,469 B2
(45) Date of Patent: May 17, 2016

(54) THREE DIMENSIONAL NAND FLASH WITH SELF-ALIGNED SELECT GATE

(75) Inventors: Jie Sun, Boise, ID (US); Brian Cleereman, Boise, ID (US); Minsoo Lee, Boise, ID (US)

(73) Assignee: INTEL CORPORATION, Santa Clara, CA (US)

(*) Notice: Subject to any disclaimer, the term of this patent is extended or adjusted under 35 U.S.C. 154(b) by 768 days.

(21) Appl. No.: 13/534,295

(22) Filed: Jun. 27, 2012

(65) Prior Publication Data

US 2014/0003148 A1    Jan. 2, 2014

(51) Int. Cl.
| | | |
|---|---|---|
| H01L 27/088 | (2006.01) | |
| H01L 21/336 | (2006.01) | |
| H01L 27/115 | (2006.01) | |
| G11C 16/04 | (2006.01) | |
| H01L 21/822 | (2006.01) | |
| H01L 27/06 | (2006.01) | |
| H01L 29/788 | (2006.01) | |
| H01L 29/792 | (2006.01) | |

(52) U.S. Cl.
CPC ...... *H01L 27/11524* (2013.01); *G11C 16/0483* (2013.01); *H01L 21/8221* (2013.01); *H01L 27/0688* (2013.01); *H01L 27/1157* (2013.01); *H01L 27/11556* (2013.01); *H01L 27/11582* (2013.01); *H01L 29/7889* (2013.01); *H01L 29/7926* (2013.01); *G11C 2213/71* (2013.01)

(58) Field of Classification Search
None
See application file for complete search history.

(56) References Cited

U.S. PATENT DOCUMENTS

| | | | |
|---|---|---|---|
| 2001/0019890 A1 | 9/2001 | Arakawa | |
| 2009/0242966 A1 | 10/2009 | Son et al. | |
| 2010/0013049 A1* | 1/2010 | Tanaka et al. | 257/532 |
| 2010/0159657 A1 | 6/2010 | Arai et al. | |
| 2010/0237400 A1* | 9/2010 | Aoyama | 257/324 |
| 2011/0002178 A1 | 1/2011 | Hwang et al. | |
| 2012/0008400 A1 | 1/2012 | Fukuzumi et al. | |
| 2012/0098051 A1 | 4/2012 | Son et al. | |
| 2012/0241842 A1 | 9/2012 | Matsuda | |
| 2013/0175494 A1 | 7/2013 | Collins et al. | |
| 2014/0029352 A1 | 1/2014 | Tanzawa | |
| 2014/0061779 A1 | 3/2014 | Kim et al. | |
| 2014/0167131 A1 | 6/2014 | Lu et al. | |

FOREIGN PATENT DOCUMENTS

| | | |
|---|---|---|
| KR | 10-2010-0053393 A | 5/2010 |
| KR | 10-2010-0097459 A | 9/2010 |
| KR | 10-2011-0034816 A | 4/2011 |
| KR | 10-2012-0029291 A | 3/2012 |

OTHER PUBLICATIONS

F. Francasi et al., "Plasma Assisted Dry Etching of Cobalt Silicide for Microelectronics Applications", Journal of The Electrochemical Society, vol. 143, No. 2, Feb. 1996, 1 page.

KR Williams, "Etch Rates for Micromachining Processing—Part II", Journal of Microelectro mechanical Systems, vol. 12, No. 6, Dec. 2003, table III, 1 page.

(Continued)

*Primary Examiner* — Robert Carpenter

(57) ABSTRACT

An integrated circuit may include a pillar of semiconductor material, a field effect transistor having a channel that is formed in the pillar of semiconductor material, and two or more memory cells, stacked vertically on top of the field effect transistor, and having channels that are formed in the pillar semiconductor of material.

6 Claims, 6 Drawing Sheets

(56) References Cited

OTHER PUBLICATIONS

International Search Report and Written Opinion Received for Patent Application No. PCT/US2013/047002, mailed on Oct. 18, 2013, 11 Pages.

Jaehoon Jang, et al., "Vertical Cell Array using TCAT (Terabit Cell Array Transistor) Technology for Ultra High Density NAND Flash Memory", Symposium on VLSI Technology Digest of Technical Papers, 2009, 2 pages.

* cited by examiner

US 9,343,469 B2

THREE DIMENSIONAL NAND FLASH WITH SELF-ALIGNED SELECT GATE

BACKGROUND

1. Technical Field

The present subject matter relates to semiconductor memories, and more specifically, to three-dimensional NAND flash memory arrays.

2. Background Art

Many types of semiconductor memory are known in the art. Some memory is volatile and will lose its contents if power is removed. Some memory is non-volatile and will hold the information stored in the memory even after power has been removed. One type of non-volatile memory is flash memory which stores charge in a charge storage region of a memory cell. In a floating gate flash cell, a conductive floating gate, positioned between the control gate and the channel of a metal-oxide silicon field effect transistor (MOSFET), is used to store a charge. In a charge trap flash (CTF) cell, a layer of non-conductive material, such as a nitride film, is used to store charge between the control gate and the channel of a MOSFET. The voltage threshold of the MOSFET-based flash cell can be changed by changing the amount of charge stored in the charge storage region of the cell, and the voltage threshold can be used to indicate a value that is stored in the flash cell.

One architecture in common use for flash memories is a NAND flash architecture. In a NAND flash architecture, two or more flash cells are coupled together, source to drain, into a string, with the individual cell control gates coupled to control lines, such as word lines. Select gates, which may be standard MOSFETs, may be coupled to the NAND string at either end, to couple the NAND string to a source line at one end of the NAND string, and to a bit line at the other end of the NAND string.

Some NAND flash devices may create stacks of flash memory cells in a three-dimensional array NAND strings. A stack of flash cells may include any number of flash cells with the source, channel, and drain arranged vertically so that as the cells are positioned, one on top of the other, they form a vertical NAND string. The vertical NAND string may be positioned on top of a select gate that may couple the string to a source line and may have another select gate positioned on top of the vertical NAND string to couple the string to a bit line.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1B:
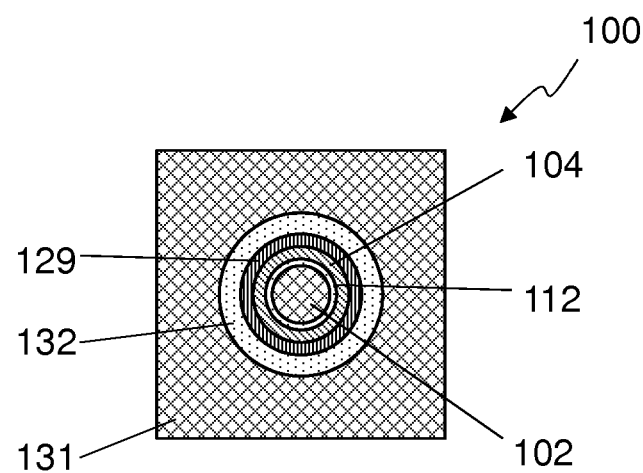
FIGS. 1A and 1B show a cross-sectional side view and a top view, respectively, of an embodiment of a three dimensional NAND flash with self-aligned select gate.
Figure 1A:
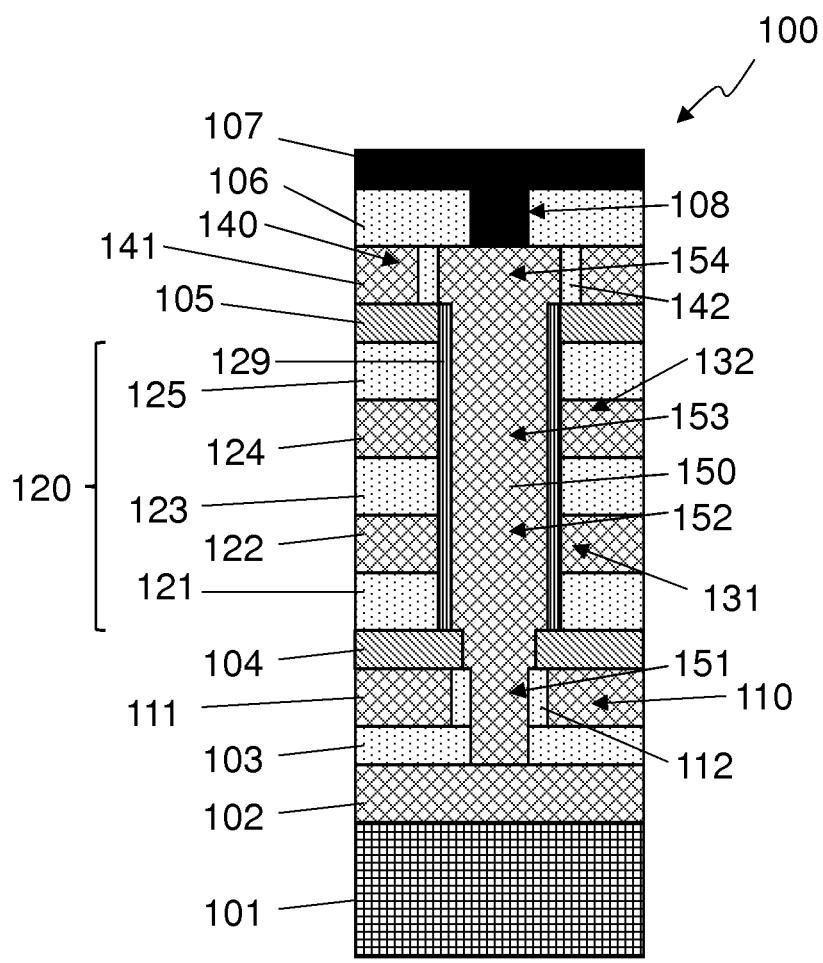
Figure 2:
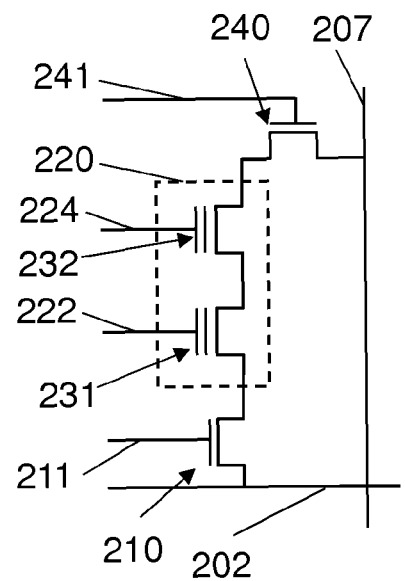
FIG. 2 shows a schematic of the three dimensional NAND flash with self-aligned select gate of FIGS. 1A and 1B.

FIGS. 1A and 1B show a cross-sectional side view and a top view, respectively, of an embodiment of a three dimensional NAND flash 100 with self-aligned select gates 110, 140. FIG. 1B has the bit line layer 107, via 108, insulating layer 106, and the pillar of semiconductor material 150 removed to allow more of the structure to be seen. While the physical orientation of the three dimensional NAND flash 100 may change with respect to gravity, for the purposes of this disclosure and associated claims, a direction toward the plane of the substrate 101, which is perpendicular to the bottom of the page of the drawings in FIG. 1A, is deemed to be down. So the view of FIG. 1B is from the top looking down, and if a layer shown in FIG. 1A, such as bit line layer 107, is farther from the bottom of the page than another layer, such as source layer 102, that layer, bit line layer 107 in this example, is above the other layer. FIG. 2 shows a schematic of the three dimensional NAND flash 200 with self-aligned select gates 210, 240 of FIGS. 1A and 1B. The three figures are discussed concurrently as they are different representations of a common apparatus, although FIG. 2 uses different reference numbers as a schematic is a more abstract representation that may not exactly match the physical elements represented in FIGS. 1A and 1B. The three dimensional NAND flash 100 may be a part of an integrated circuit, such as a NAND flash memory device, a processor, or some other type of integrated circuit.

The three dimensional NAND flash 100 may be fabricated on a substrate 101, which may be a silicon wafer in some embodiments. The substrate 101 may have various layers, films, patterned areas, doped areas, or other material below the conductive source layer 102 so the substrate 101 may refer to more than simply a raw wafer. Conductive source layer 102 may be used as a source line 202 of a memory array, such as memory array 317 of FIG. 3. The conductive source layer 102 may be made of any conductive material, including, but not limited to, doped crystalline silicon (Si), polysilicon, metals or metal alloys including aluminum, copper, nickel or other metals, or any other conductive material. In some embodiments, the conductive source layer 102 may be a doped area of the silicon wafer, but in other embodiments, the conductive source layer 102 may be made of material deposited on top of the substrate 101.

A select gate source (SGS) metal-oxide field effect transistor (MOSFET, or simply FET) 110, which may be represented by FET 210 in FIG. 2, may be fabricated to couple to the conductive source layer 102. The SGS FET 110 may include a control gate fabricated in a conductive select gate source layer 111, which may be made of any conductive material, but may be made with polysilicon in some embodiments. A source control line 211 may couple to the control gate of the SGS FET 110 in the conductive select gate source layer 111. The select gate source layer 111 may be isolated from the conductive source layer 102 by a first insulating layer 103 which may be made of any insulating material, but in some embodiments, may be an oxide or a nitride such as a silicon oxide ($Si_mO_n$ or generically SiO). The first insulating layer 103 may also function as an etch stop layer during fabrication in some embodiments. Gate dielectric 112, which may be SiO in some embodiments, may be positioned between material of the select gate source layer 111 and a pillar of semiconductor material 150, which may be used as the channel 151 of the SGS FET 110. The pillar 150 may be any suitable semiconductor material, including, but not limited to silicon, polysilicon, doped polysilicon, gallium-arsenide (GAs), or other semiconducting materials. The pillar 150 may be a single monolithic pillar of semiconductor material in various embodiments, without any interfaces, seams, or large defects between the various channels 151-154 within the pillar 150. The pillar 150 may be created in its entire length by one fabrication process step, so that the pillar 150 is relatively uniform in composition throughout its length in some embodiments. The pillar 150 may be in electrical contact with the conductive source layer 102, and may also function as the source of SGS FET 110 below the channel 151 and the drain of the SGS FET 110 above the channel 151.

A stack of memory cells 120 may be formed on top of the SGS FET 110. A second insulating layer 104 may isolate the stack of memory cells 120 from the select gate source layer 111, and may also function as an etch stop layer during fabrication in some embodiments. The second insulating layer 104 may be made of any insulating material, including high dielectric constant film and multiple layers of conducting and/or insulating sandwich films, but the material may be chosen for high etch selectivity compared to the materials of the stack 120. The stack of memory cells 120 may be formed vertically, meaning that one memory cell 132 is above another memory cell 131, for a stack of two memory cells. Any number of memory cells may be included in the stack of memory cells 120, which may be shown as the NAND string 220 of FIG. 2. For embodiments with more than two memory cells in the stack of memory cells 120, the vertical orientation of the stack may be interpreted as the second cell being positioned above the first cell, the third cell being positioned above the second cell, and the fourth cell being positioned above the third cell, with additional cells being positioned similarly above the other cells. In some embodiments, the cells may not be positioned exactly one on top of the other, as there may be some times where the various layers may be of different sizes or somewhat off-center from each other, but the cells of the stack of memory cells 120 use the pillar of semiconductor material 150 to form their channels.

In some embodiments, the memory cells may be field effect transistors (FETs) 231, 232 having a charge storage mechanism located between a control gate and the channel. The charge storage mechanism may be a conductive floating gate, as may be used in floating gate flash memory, or a non-conductive charge trapping layer, as may be used in a charge trap flash (CTF) memory, which may also be referred to as a silicon-oxide-nitride-oxide-silicon (SONOS) memory. Either mechanism, or some other mechanism, may be used for embodiments, and is represented generically by the charge storage film 129. The charge storage film 129 may also function as a gate dielectric for the FETs 231, 232, and may include one or more layers of various materials that may be patterned or unpatterned, such as, but not limited to, SiO or other oxides, polysilicon, silicon nitride (SiN) or other nitrides, various metals or metallic compounds, or any other suitable material.

The stack of memory cells 120 may include various layers of material. In the embodiment shown, the stack of memory cells 120 includes a bottom insulating layer 121, a first cell gate conductive layer 122, a middle insulating layer 123, a second cell gate conductive layer 124 and a top insulating layer 125 deposited on top of each other. Other layers and or films may be included in some embodiments and other embodiments may eliminate some of the layers shown, such as the bottom insulating layer 121, and/or the top insulating layer 125. The first flash cell 231 of the schematic of FIG. 2 may correspond to the flash cell 131 of FIG. 1A and the second flash cell 232 of FIG. 2 may correspond to the flash cell 132 of FIG. 1A. A first word line 222 of FIG. 2 may be formed in the first cell gate layer 122, along with a control gate for the flash cell 231, and a second word line 224 of FIG. 2 may be formed in the second cell gate layer 124, along with a control gate for the flash cell 232. The insulating layers 121, 123, 125 may be made with any type of insulating material, but may be made with SiO in at least one embodiment. The cell gate layers 122, 124 may be made of any type of conductive material but may be made with polysilicon in at least one embodiment.

The charge storage film 129 may act as a gate oxide to isolate the control gate from the channel 152 of the first flash cell 131 and to isolate the control gate from the channel 153 of the second flash cell 132. The charge storage film 129 may have a non-uniform thickness and may be very thin or non-existent at the insulating layers 121, 123, 125 in some embodiments. In some embodiments, the charge storage film 129 may be recessed between the insulating layers 121, 123, 125, with the conductive material of the gate layers 122, 124 etched back further than the insulating layers 121, 123, 125, creating annular rings of charge storage material. The pillar 150 may be tapered, as shown in FIG. 1A, or it may have a relatively constant diameter throughout its height. In other embodiments, the pillar 150 may have an irregular diameter, being wider at some layers and narrower at others. The pillar 150 may be roughly circular in cross-section as shown, although other embodiments may have an oval, polygonal, or any other shape cross-section.

The channels of the flash cells 131, 132 may be formed in the pillar of semiconductor material 150 with the pillar 150 also acting as the source and drain for the flash cells 131, 132 to form a NAND string of flash cells. The source of the first flash cell 131 may couple to the drain of the select gate source FET 110 in the pillar 150 without a discontinuity between the channel 151 of the select gate source FET 110 and the channel 152 of the first flash cell 131. Similarly, the flash cells 131, 132 of the NAND string 120 may have their channels 152, 153 coupled together through the pillar 150 without a discontinuity. By using a pillar of semiconductor material for the channels without a discontinuity between the FETs, defects may have less impact on the current flow through the NAND string and there may be a lower voltage loss through the NAND string as it is conducting. Another parameter that may help decrease the impact of defects on the current flow through the NAND string is decreased dimensional offset. If the offset between layers is reduced, the dimensional offset may be decreased. Likewise, if the dimensional change between layers is reduced, the dimensional offset may be decreased. Some embodiments may have other material in the channel areas of the select gate source FET 110 and/or the flash cells 131, 132, such as inter-poly dielectric films or polysilicon liners that are not a part of the pillar of semiconductor material 150, but as long as a part of the conductive channel of an activated switching device, such as select gate source FET 110 and/or the flash cells 131, 132, is in the pillar of semiconductor material 150, the channel may be deemed as being formed in the pillar of semiconductor material 150.

In some embodiments a non-conductive layer 105 may be formed on top of the stack of memory cells 120, which may be made of any insulating material but may be made of a nitride in at least one embodiment, and may isolate the stack of memory cells 120 from the select gate drain layer 141. The non-conductive layer 105 may also function as an etch stop layer during fabrication in some embodiments. A select gate drain (SGD) FET 140, which may be represented by FET 240 in FIG. 2, may be fabricated on top of the stack of memory cells 120 in some embodiments. The SGD FET 140 may include a control gate fabricated in a conductive select gate drain layer 141 which may be made of any conductive material. A source control line 241 may couple to the control gate of the SGD FET 140, 240 in the conductive select gate drain layer 141. The select gate drain layer 141 may be isolated from the bit line layer 107 by one or more insulating layers 106 which may be made of any insulating material, but in at least some embodiments, may be made of a nitride or a carbon-based material. Gate dielectric 142, which may be SiO in some embodiments, may be positioned between the select gate drain layer 141 and the pillar of semiconductor material 150, which may be used as the channel 154 of the SGD FET 140. The pillar 150 may also function as the source of SGD FET 140 below the channel 154 and the drain of the SGD FET 140 above the channel 154 in some embodiments. In some embodiments, the channel 154 of the SGD FET 140 may be coupled to the channel 153 of the top flash cell 132 of the stack of memory cells 120 within the pillar 150 without a discontinuity. The drain of the SGD FET 140, 240 may be coupled by via 108 to a bit line 207 fabricated in the bit line layer 107.

Figure 1C:
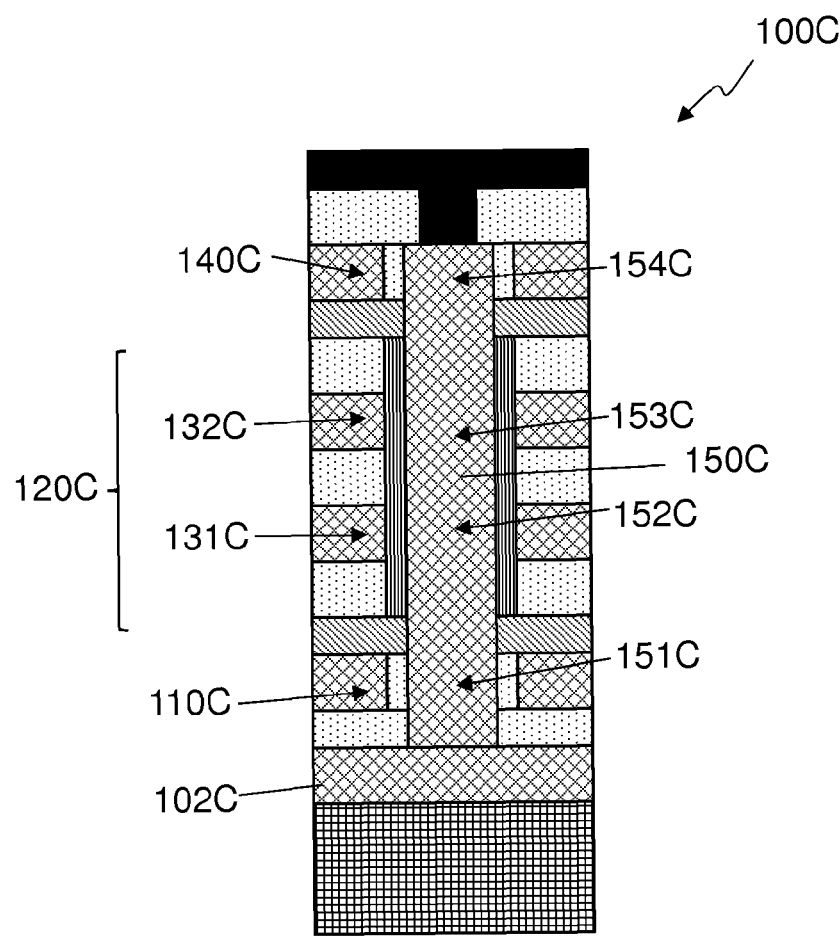
FIG. 1C shows a cross-sectional side view of an alternative embodiment of a three dimensional NAND flash with self-aligned select gate.

FIG. 1C shows a cross-sectional side view of an alternative embodiment of a three dimensional NAND flash 100C with self-aligned select gate 110C, 140C. The three dimensional NAND flash 100C is very similar to the three dimensional NAND flash 100 of FIG. 1A/B, but the pillar of semiconductor material 150C has a substantially constant diameter throughout its length. The various layers of the three dimensional NAND flash 100C are substantially the same as those in the three dimensional NAND flash 100. A SGS FET 110C may be formed above a conductive source layer 102C and an array stack 120C that includes NAND string made of flash cell 131C and flash cell 132C may be positioned above of the SGS FET 110C. A SGD FET 140C may be positioned above the array stack 120C. A pillar of semiconductor material 150C may extend through the SGD FET 140C, the flash cell 131C, the flash cell 132C and the SGS FET 110C to the source layer 102C. In the embodiment shown, the pillar 150C may be substantially cylindrical in shape and have a substantially constant diameter throughout its length. The channel 151C of the SGS FET 110C, the channel 152C of the flash cell 131C, the channel 153C of flash cell 132C, and the channel of the SGD FET 140C may be formed in the pillar of semiconductor material 100C. By making the diameter of the pillar 150C substantially constant, and by self-aligning the select gates as shown in FIG. 5A-G, the dimensional offset may be minimized. So in some embodiments, the pillar of semiconductor material 150C has a cross-section that is substantially unchanged throughout its length. A substantially unchanged cross-section may be defined to mean that that at any point the distance from the center of the pillar 150C to any point on the pillar's surface at a given polar angle may not vary by more than 10%.

Figure 3:
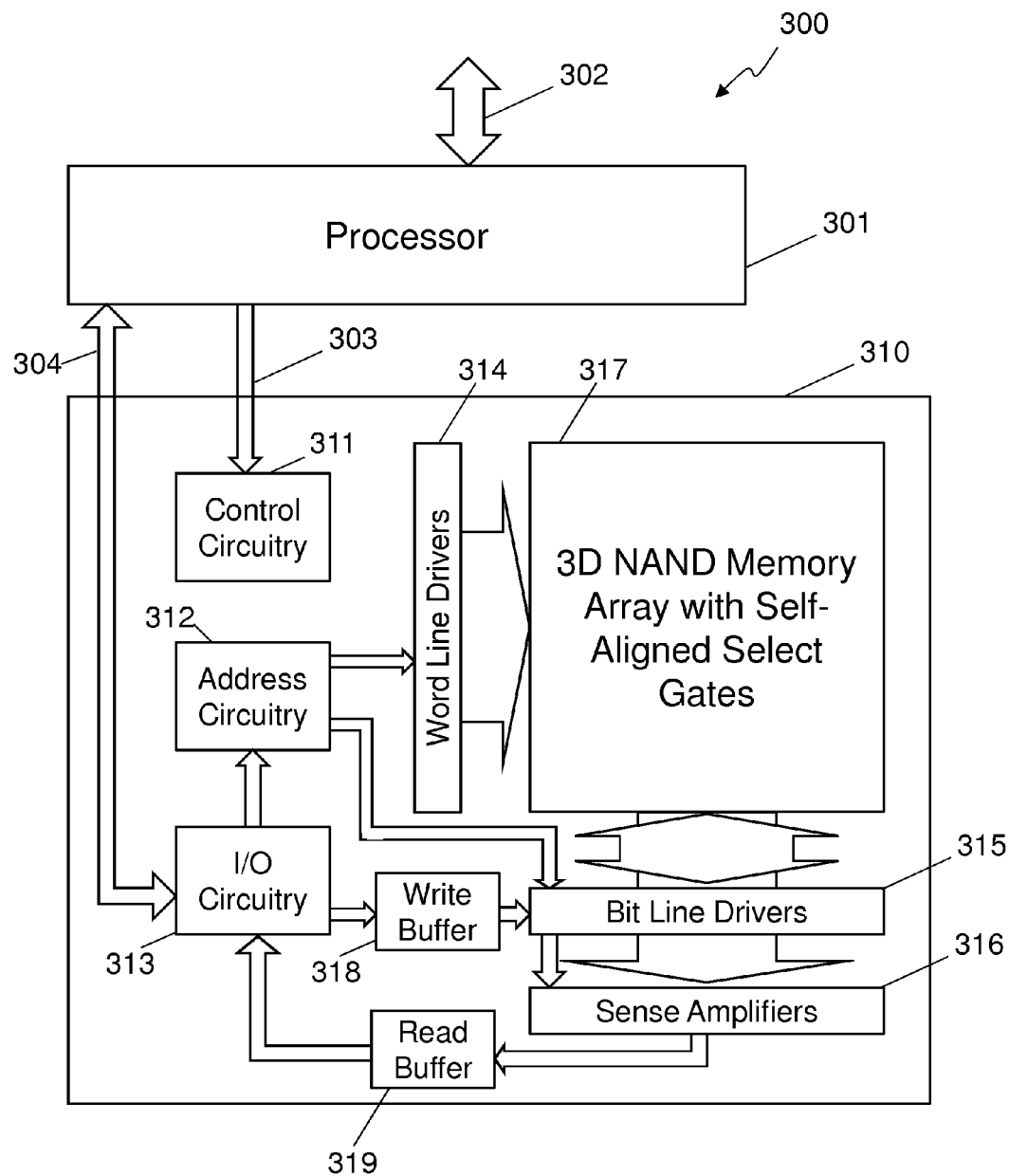
FIG. 3 is a block diagram of an embodiment of an electronic system using a three dimensional NAND flash with self-aligned select gate.

FIG. 3 is a block diagram of an embodiment of an electronic system 300 that includes a memory device 310 having a memory array 317 using a three dimensional NAND flash memory with self-aligned select gates. A processor 301 is coupled to the memory device 310 with control/address lines 303 and data lines 304. In some embodiments, data and control may utilize the same lines. The processor 301 may be an external microprocessor, microcontroller, or some other type of external controlling circuitry. In some embodiments, the processor 301 may be integrated in the same package or even on the same die as the memory device 310. In some embodiments, the processor 301 may be integrated with the control circuitry 311, allowing some of the same circuitry to be used for both functions. The processor 301 may have external memory, such as random access memory (RAM) and read only memory (ROM), used for program storage and intermediate data or it may have internal RAM or ROM. In some embodiments, the processor may use the memory device 310 for program or data storage. A program running on the processor 301 may implement many different functions including, but not limited to, an operating system, a file system, defective chunk remapping, and error management.

In some embodiments an external connection 302 is provided. The external connection 302 is coupled to the processor 301 and allows the processor 301 to communicate to external devices. Additional circuitry may be used to couple the external connection 302 to the processor 301. If the electronic system 300 is a storage system, the external connection 302 may be used to provide an external device with non-volatile storage. The electronic system 300 may be a solid-state drive (SSD), a USB thumb drive, a secure digital card (SD Card), or any other type of storage system. The external connection 302 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If the electronic system 300 is a computing system, such as a mobile telephone, a tablet, a notebook computer, a set-top box, or some other type of computing system, the external connection 302 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)-Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 310 may include an array 317 of memory cells. The memory cells may be organized into three dimensional stacks of memory cells, such as vertical NAND strings. The vertical NAND strings may be coupled with self-aligned select gates as shown in FIG. 1A/B. Address lines and control lines 303 may be received and decoded by control circuitry 311, I/O circuitry 313 and address circuitry 312 which may provide control to the memory array 317. I/O circuitry 313 may couple to the data lines 304 allowing data to be received from and sent to the processor 301. Data read from the memory array 317 may be temporarily stored in read buffers 319. Data to be written to the memory array 317 may be temporarily stored in write buffers 318 before being transferred to the memory array 317.

The system illustrated in FIG. 3 has been simplified to facilitate a basic understanding of the features of the memory. Many different embodiments are possible including using a single processor 302 to control a plurality of memory devices 310 to provide for more storage space. Additional functions, such as a video graphics controller driving a display, and other devices for human oriented I/O may be included in some embodiments.

Figure 4:
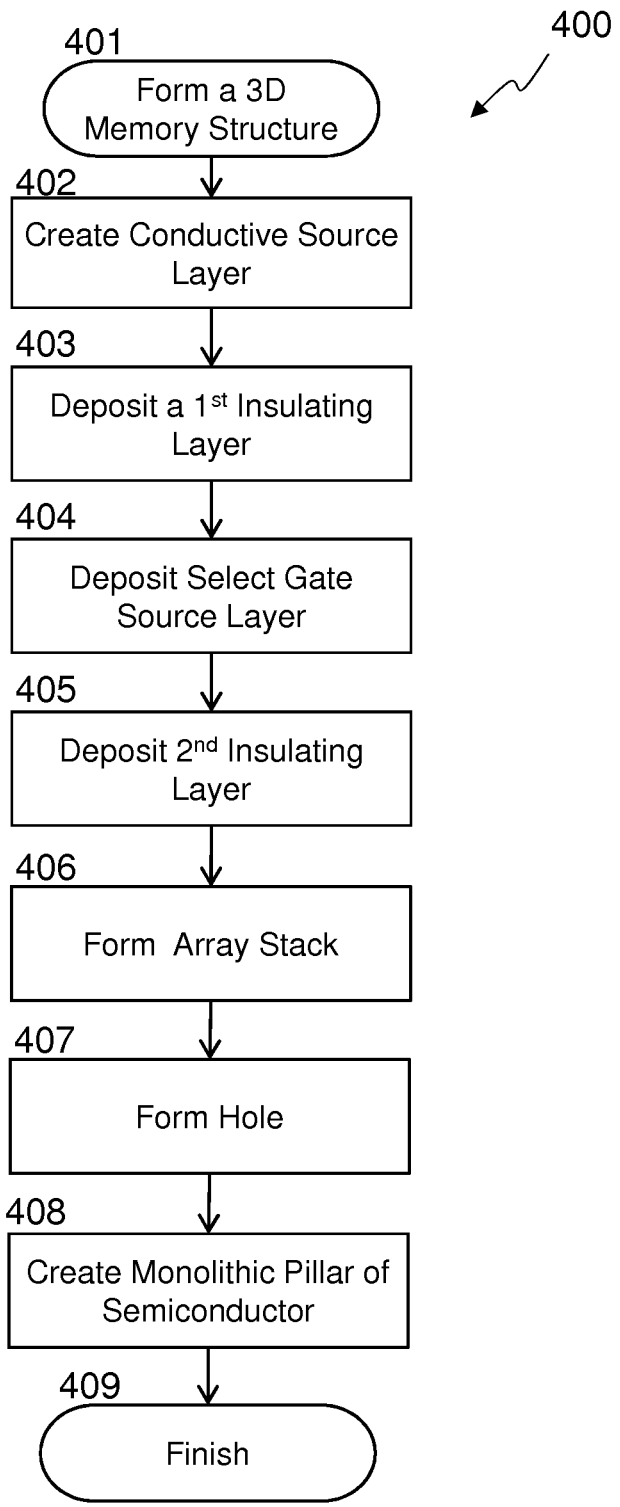
FIG. 4 is a flowchart of an embodiment of a method to fabricate a three dimensional memory structure.

FIG. 4 is a flowchart 400 of an embodiment of a method to fabricate a three dimensional memory structure and FIG. 5A-G show cross sectional side views of various stages of the method shown in FIG. 4. FIG. 4 and FIG. 5A-G are discussed together below.

Flowchart 400 may begin to form a 3D memory structure at block 401 and may create a conductive source layer 502 above a substrate 501 at block 402. A first insulating layer 503 may be created above the conductive source layer 502 at block 403. The term "above," as used herein and in the claims, means that the conductive source layer 502 is between the substrate 501 and the first insulating layer 503, but although the conductive source layer 502 and the first insulating layer 503 may be in direct contact in some embodiments, other embodiments may include additional layers, films or other material, between the conductive source layer 502 and the first insulating layer 503. Creating a layer may be performed by any process, including, but not limited to, deposition of a material, implantation or doping of an existing material, or inducing a chemical reaction at the surface of an existing material.

Figure 5A:
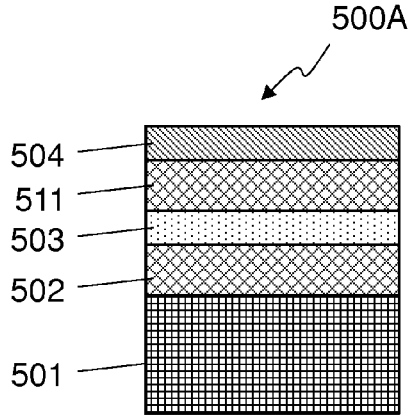
FIG. 5A-G show cross-sectional side views of various stages of the method shown in FIG. 4.
Figure 5B:
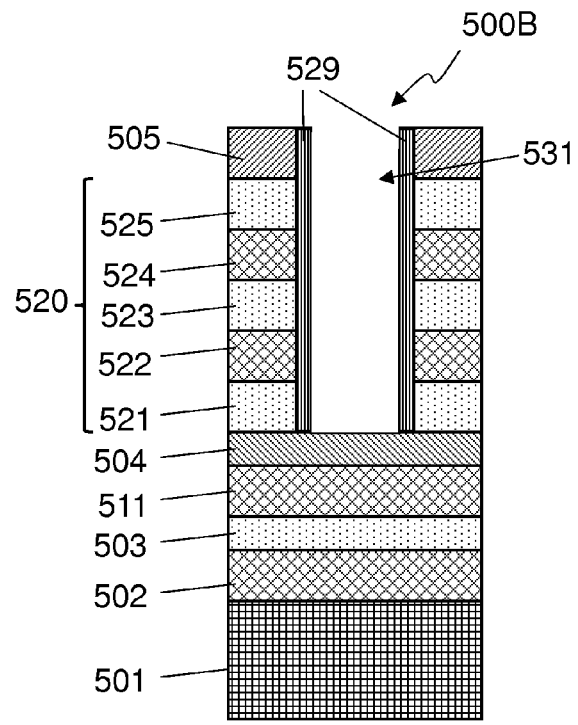
Figure 5C:
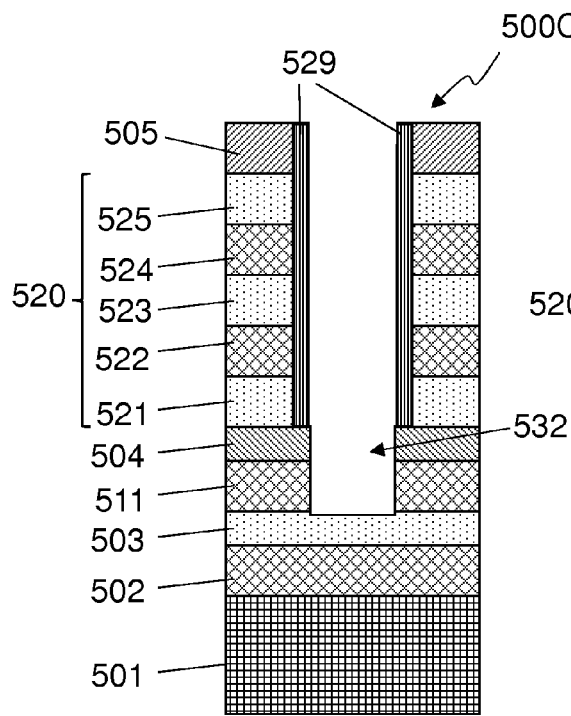
Figure 5D:
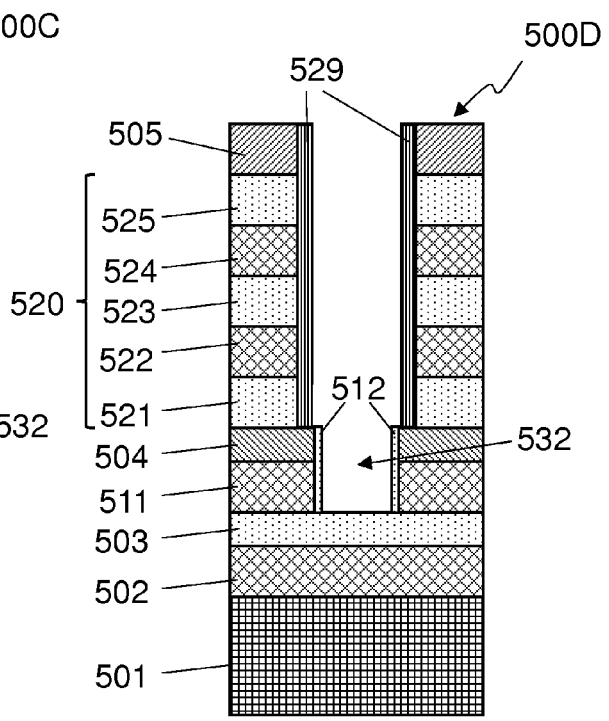
Figure 5E:
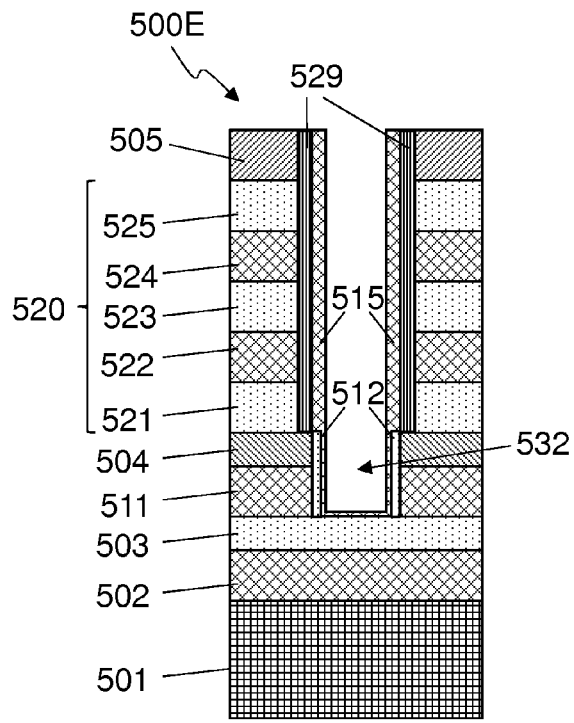

A select gate source layer 511 may be deposited above the first insulating layer 503 at block 404, and a second insulating layer 504 may deposited above the select gate source layer 511 at block 405 to create the work-in-process (WIP) integrated circuit (IC) 500A of FIG. 5A. The second insulating layer 504 and the select gate source layer 511 may not be patterned to form a channel for the SGS FET, although a control gate of the SGS FET and/or a source line may be patterned in the select gate source layer 511. The source layer 502 and the select gate source layer 511 may be made of any conductive material but may be made with polysilicon in at least one embodiment. The first insulating layer 503 and the second insulating layer 504 may be made of any non-conductive material but may be made with oxides in at least one embodiment.

An array stack 520 may be formed above the first insulating layer 504 at block 406 of the flowchart 400. In some embodiments, the array stack 520 may be formed by creating alternating layers of insulating material 521, 523, 525 and conductive material 522, 524 above the first insulating layer 504. In some embodiments, various other layers or films may be included between the alternating insulating layers 521, 523, 525 and conductive layers 522, 524. Patterning and/or etching processes may be performed at various stages during the formation of the array stack 520. An array channel hole 531 may be created, using etching or various other techniques, through the alternating insulating layers 521, 523, 525 and conductive layers 522, 524 down to the second insulating layer 504. The array channel hole 531 may be roughly circular in many embodiments although some embodiments may use other shapes. One or more films of material 529 to store charge on an inside of the array channel hole 531 to create the WIP IC 500B of FIG. 5B. The one or more films of material 529 may be patterned in some embodiments although other embodiments may not pattern the films 529. The films 529 may create charge storage regions such as conductive floating gate or non-conductive charge trapping layers and the films 529 may be suitable for gate dielectric of a FET.

Figure 5F:
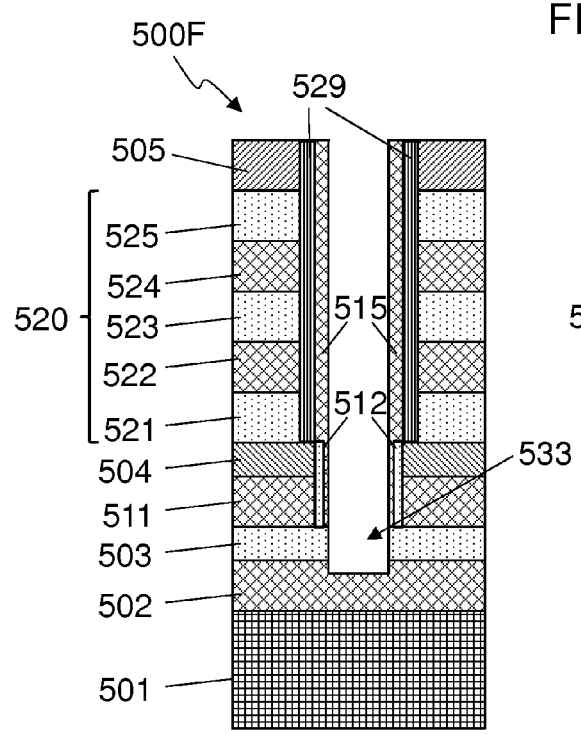

A hole 533, as shown in FIG. 5F, may be formed at block 407. The hole 533 may be formed in several stages in some embodiments. In at least one embodiment, the first stage of forming the hole 533 may occur by creating the array channel hole 531 through the array stack 520. The array channel hole 531 may be extended through the second insulating layer 504 and the select gate source layer 511 to form a select channel hole 532, creating the WIP IC 500C of FIG. 5C. A gate dielectric film 512 may be formed on the exposed the select gate layer 511 in the select channel hole 532 to create the WIP IC 500D of FIG. 5D. The gate dielectric film 512 may also be deposited on exposed areas of other layers, such as the second insulating layer 504 in some embodiments. In some embodiments, a thin polysilicon liner 515 may be deposited on the inside of the select channel hole 532 to create the WIP IC 500E of FIG. 5E and the select channel hole 532 may be extended through the polysilicon liner 515 on the bottom of the select channel hole 532 and through the first insulating layer 503 to the source layer 502 to form the hole 533, creating the WIP IC 500F of FIG. 5F. After the hole 533 is formed, the hole 533 may extend at least through the array stack 520, the second insulating layer 504, the select gate source layer 511, and the first insulating layer 503 to the conductive source layer 502, and may be approximately coaxial with the array channel hole 531. In some embodiments, the hole 533 may extend into the conductive source layer 502 to some depth or may even extend through the conductive source layer 502 in some embodiments.

Figure 5G:
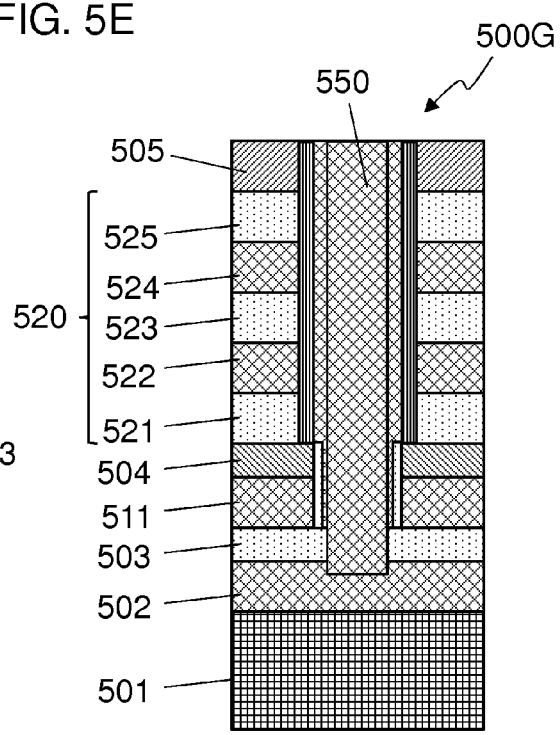

The flowchart 400 may continue at block 408 to create a pillar of semiconductor material 550 in the hole 533 to create the WIP IC 500G of FIG. 5G. The pillar of semiconductor material 550, which may be made of polysilicon in some embodiments, may be in electrical contact with the conductive source layer 502. The pillar 550 is a monolithic volume of semiconductor material that is continues through the various layers of the stack of memory cells 520 and SGS FET to connect to the source layer 502. The flowchart 400 may finish at block 409.

In some embodiments, a select gate drain (SGD) FET may be fabricated on top of the array stack before the hole 533 is formed. In such embodiments, a select gate drain layer may be deposited above the array stack between block 406 and block 407 of the flowchart 400. Insulating layers may be deposited above the select drain layer in some embodiments. A select drain channel hole may be created through for the select gate drain layer either as a part of creating the hole 533 at block 407 or as a separate operation before the hole 533 is created at block 407. The hole 533 may be approximately coaxial with the select drain channel hole. In such embodiments, the pillar of semiconductor material 550 may also extend through the select drain channel hole.

By forming the hole 533 after the various layers are deposited, it may be possible to minimize registration errors between the select gates and the NAND string as compared to processes that pattern the select gate before forming the NAND string. The method shown in FIG. 4 may also simplify the process flow and may offer a cost reduction by eliminating process steps as compared to processes that may pattern the select gate before forming the NAND string. The method shown in FIG. 4 may also increase NAND string current by forming a monolithic channel without discontinuity. The method shown in FIG. 4 may also eliminate multiple high temperature processes as compared to traditional methods of forming a vertical NAND string which may pattern the select gate before and after the NAND string.

Examples of various embodiments are described in the following paragraphs:

An example integrated circuit may include a pillar of semiconductor material, a field effect transistor having a channel that is formed in the pillar of semiconductor material, and two or more memory cells, stacked on the field effect transistor, and having channels that are formed in the pillar of semiconductor of material. In some example integrated circuits, the pillar of semiconductor material is made of polysilicon. In some example integrated circuits, the pillar of semiconductor material has a cross-section that is substantially unchanged throughout its length. In some example integrated circuits, the two or more memory cells include a field effect transistor having a charge storage mechanism located between a control gate and the channel, and the charge storage mechanism comprises a conductive floating gate or a non-conductive charge trapping layer. In some example integrated circuits, the two or more memory cells are flash memory cells coupled together into a NAND string, and the field effect transistor is coupled to the NAND string to function as a select gate. Some example integrated circuits also include a second field effect transistor, positioned on top of the two or more memory cells, and having a channel that is formed in the pillar of semiconductor material. In some example integrated circuits, the two or more memory cells are flash memory cells coupled together into a NAND string, and the field effect transistor and the second field effect transistor are coupled to the NAND string, at opposite ends of the NAND string, to function as select gates. Any combination of the examples of this paragraph may be used in embodiments.

An example electronic system may include a processor to generate memory control commands, and at least one memory, coupled to the processor, to respond to the memory control commands, the at least one memory as described in the previous paragraph. Some example electronic systems may include I/O circuitry, coupled to the processor, to communicate with an external device. Any combination of the examples of this paragraph and the previous paragraph may be used in embodiments.

An example method to fabricate a three dimensional memory structure may include creating a conductive source layer, creating a first insulating layer above the conductive source layer, creating a select gate source layer above the first insulating layer, and a second insulating layer above the select gate source layer, without substantially patterning a channel, forming an array stack above the first insulating layer, forming a hole through the array stack, the second insulating layer, the select gate source layer, and the first insulating layer to the conductive source layer, and creating a pillar of semiconductor material in the hole, the pillar of semiconductor material in electrical contact with the conductive source layer. Some example methods may also include forming a gate dielectric film on the exposed the select gate layer in the hole before the creation of the pillar of semiconductor material. In some example methods, the conductive source layer, the select gate source layer, and the pillar of semiconductor material may be made of polysilicon, and the first and second insulating layers comprise oxide. In some example methods, the formation of the hole is accomplished by creating the hole through the array stack, the second insulating layer, and the select gate layer, creating a film of gate oxide on exposed areas of the select gate source layer, creating a polysilicon liner on an inside surface of the hole, and extending the hole through the polysilicon liner and the first insulating layer to the conductive source layer. Some example methods may also creating a select gate drain layer above the array stack, and creating a select drain channel hole through the select gate drain layer. In some example methods the hole is approximately coaxial with the select drain channel hole of the select gate drain layer, and the pillar of semiconductor material also extends through select drain channel hole. In some example methods the formation of the array stack may be accomplished by creating alternating layers of insulating material and conductive material, creating an array channel hole through the alternating layers, and creating one or more films of material to store charge on an inside of the array channel. In some example methods the hole is approximately coaxial with the array channel hole. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A method to fabricate a three dimensional memory structure comprising:
    creating a conductive source layer;
    creating a first insulating layer above the conductive source layer;
    creating a select gate source layer above the first insulating layer, and a second insulating layer above the select gate source layer, without substantially patterning a channel;
    forming an array stack above the first insulating layer, wherein the array stack is formed at the same time as the select gate source layer is created;
    forming a hole through the array stack, the second insulating layer, the select gate source layer, and the first insulating layer to the conductive source layer; and
    creating a pillar of semiconductor material in the hole, the pillar of semiconductor material in electrical contact with the conductive source layer;
    wherein the hole is formed after the array stack, the second insulating layer, the select gate source layer, and the first insulating layer are formed to reduce registration errors between the select gate source layer and the array stack.

2. The method of claim 1, further comprising:
    forming a gate dielectric film on the exposed the select gate layer in the hole before the creation of the pillar of semiconductor material.

3. The method of claim 1, wherein the conductive source layer, the select gate source layer, and the pillar of semiconductor material comprise polysilicon; and the first and second insulating layers comprise oxide.

4. The method of claim 3, wherein the formation of the hole comprises:

creating the hole through the array stack, the second insulating layer, and the select gate layer;

creating a film of gate oxide on exposed areas of the select gate source layer;

creating a polysilicon liner on an inside surface of the hole; and extending the hole through the polysilicon liner and the first insulating layer to the conductive source layer.

5. The method of claim 1, further comprising:

creating a select gate drain layer above the array stack; and creating a select drain channel hole through the select gate drain layer;

wherein the hole is approximately coaxial with the select drain channel hole of the select gate drain layer; and the pillar of semiconductor material also extends through select drain channel hole.

6. The method of claim 1, wherein the formation of the array stack comprises:

creating alternating layers of insulating material and conductive material;

creating an array channel hole through the alternating layers; and creating one or more films of material to store charge on an inside of the array channel;

wherein the hole is approximately coaxial with the array channel hole.

\* \* \* \* \*